United States Patent
Kim

(10) Patent No.: US 10,748,821 B2
(45) Date of Patent: Aug. 18, 2020

(54) METHOD AND SYSTEM FOR MEASURING PATTERN PLACEMENT ERROR ON A WAFER

(71) Applicant: SAMSUNG ELECTRONICS CO., LTD., Suwon-si, Gyeonggi-Do (KR)

(72) Inventor: Gyeongseop Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 7 days.

(21) Appl. No.: 15/863,041

(22) Filed: Jan. 5, 2018

(65) Prior Publication Data

US 2018/0315671 A1   Nov. 1, 2018

Related U.S. Application Data

(60) Provisional application No. 62/490,330, filed on Apr. 26, 2017.

(51) Int. Cl.
| | |
|---|---|
| *H01L 21/66* | (2006.01) |
| *H01L 21/027* | (2006.01) |
| *H01L 27/02* | (2006.01) |
| *G03F 1/44* | (2012.01) |
| *G03F 7/20* | (2006.01) |
| *G06F 30/20* | (2020.01) |
| *G06F 30/392* | (2020.01) |

(52) U.S. Cl.
CPC ............... *H01L 22/12* (2013.01); *G03F 1/44* (2013.01); *G03F 7/70616* (2013.01); *G03F 7/70683* (2013.01); *G06F 30/20* (2020.01); *G06F 30/392* (2020.01); *H01L 21/0274* (2013.01); *H01L 27/0203* (2013.01); *H01L 22/30* (2013.01)

(58) Field of Classification Search
CPC . H01L 22/12; H01L 20/0274; H01L 27/0203; G06F 17/5009; H06F 17/5072
See application file for complete search history.

(56) References Cited

U.S. PATENT DOCUMENTS

| | | | |
|---|---|---|---|
| 6,706,456 B2 | 3/2004 | Miyashita et al. |
| 7,075,639 B2 | 7/2006 | Adel et al. |
| 7,181,057 B2 | 2/2007 | Adel et al. |
| 7,667,842 B2 | 2/2010 | Schulz |
| 7,876,438 B2 | 1/2011 | Ghinovker et al. |
| 8,148,682 B2 | 4/2012 | Hotta et al. |
| 8,810,774 B2 | 8/2014 | Iwai et al. |
| 9,196,033 B2 | 11/2015 | Hashimoto et al. |
| 9,305,884 B1 | 4/2016 | Liou et al. |
| 9,557,655 B2 | 1/2017 | Kim et al. |

(Continued)

*Primary Examiner* — Zandra V Smith
*Assistant Examiner* — Andre C Stevenson
(74) *Attorney, Agent, or Firm* — F. Chau & Associates, LLC

(57) ABSTRACT

A method for measuring pattern placement error (PPE) on a wafer includes receiving a photomask pattern. One or more unit cell patterns are added to the photomask pattern. Each of the unit cell patterns includes at least one reference design pattern and at least one PPE check design pattern. A photomask is fabricated from the photomask pattern with the one or more unit cell patterns added thereto. A wafer is patterned using the fabricated photomask. A microscope image of the patterned wafer is acquired. Pattern placement error is measured as a displacement between the at least one reference design pattern and the at least one PPE check design pattern.

13 Claims, 8 Drawing Sheets

(56) References Cited

U.S. PATENT DOCUMENTS

| | | |
|---|---|---|
| 9,594,309 B2 | 3/2017 | Huang et al. |
| 2013/0295698 A1* | 11/2013 | Pforr .......................... G03F 1/38 438/14 |
| 2017/0023358 A1 | 1/2017 | Lee et al. |
| 2017/0038671 A1 | 2/2017 | Takai |

* cited by examiner

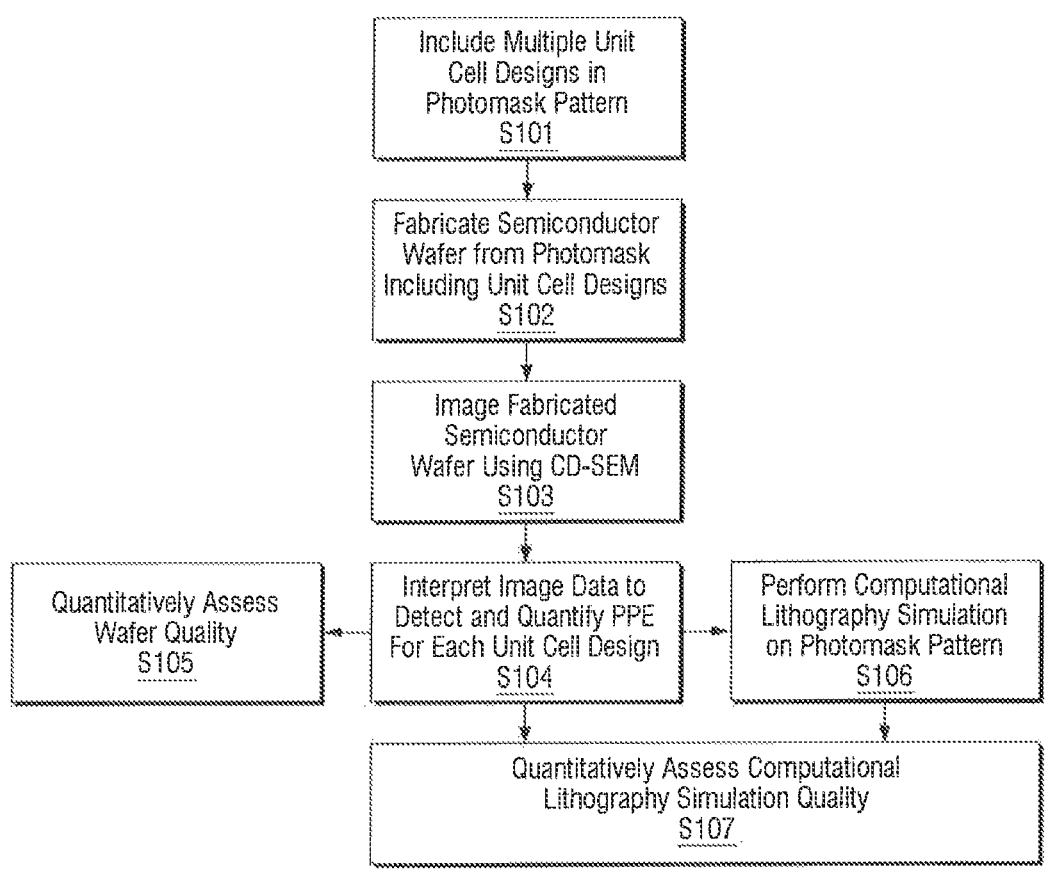

FIG. 3
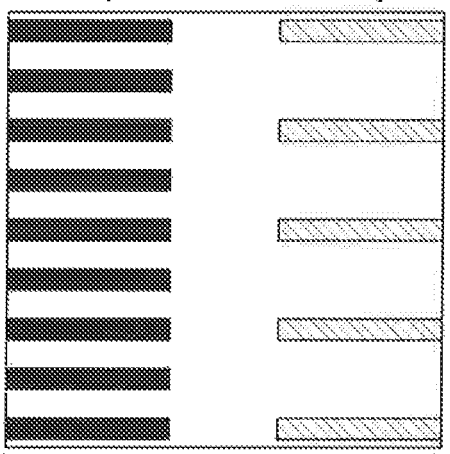
301
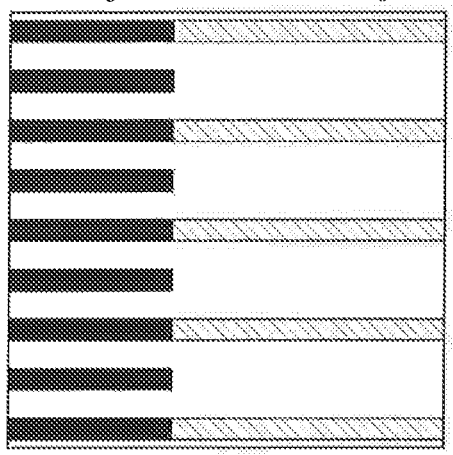
302
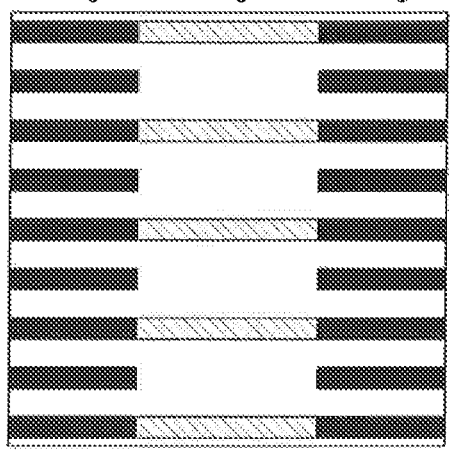
303

METHOD AND SYSTEM FOR MEASURING PATTERN PLACEMENT ERROR ON A WAFER

CROSS-REFERENCE TO RELATED APPLICATION

The present application is based on provisional application Ser. No. 62/490,330, filed Apr. 26, 2017, the entire contents of which are herein incorporated by reference.

TECHNICAL FIELD

The present disclosure relates to pattern placement error and, more specifically, to a method and system for measuring pattern placement error on a wafer.

DISCUSSION OF THE RELATED ART

In the field of semiconductor fabrication, often circuitry is created on a semiconductor wafer through a photolithography process by which a photomask (also referred to as a reticle) is used to provide a particular exposure to the wafer, for example, using extreme ultraviolet (EUV) light. Subsequent processing may etch away the exposed regions of the wafer (or the non-exposed regions) to create a pattern on the wafer.

Often, multiple photomasks (and multiple exposures) are used to fabricate the semiconductor and so it is important that exposures from each photomask are properly aligned. Moreover, misalignment of even a single photomask pattern upon the semiconductor wafer can cause defects.

Misalignment of the photomask pattern upon the semiconductor wafer may be known as pattern shift. Pattern shift, otherwise known as pattern placement error (PPE), may lead to a defective semiconductor. PPE may be caused by the EUV lithography. While PPE may be predicted using computational lithography simulation, computational lithography simulation does not detect or quantify PPE on the wafer.

SUMMARY

A method for measuring pattern placement error (PPE) on a wafer includes receiving a photomask pattern. One or more unit cell patterns are added to the photomask pattern. Each of the unit cell patterns includes at least one reference design pattern and at least one PPE check design pattern. A photomask is fabricated from the photomask pattern with the one or more unit cell patterns added thereto. A wafer is patterned using the fabricated photomask. A microscope image of the patterned wafer is acquired. Pattern placement error is measured as a displacement between the at least one reference design pattern and the at least one PPE check design pattern.

Computational lithography simulation may be performed on the photomask pattern. The results of the computational lithography simulation may be compared with the measured pattern placement error to determine an efficacy of the computational lithography simulation.

The one or more unit cell patterns may be added to the photomask pattern either at periodic intervals or at predetermined positions.

Each of the unit cell patterns may include a plurality of parallel lines.

The plurality of parallel lines may include a first set of parallel lines that are part of the reference design pattern and a second set of parallel lines that are part of the PPE check design pattern.

The first set of parallel lines may be more densely spaced than the second set of parallel lines.

The first set of parallel lines may be spaced apart from the second set of parallel lines.

The first set of parallel lines may be in contact with the second set of parallel lines.

The first set of parallel lines may be disposed on opposite sides of the second set of parallel lines.

The first set of parallel lines may be spaced apart at equal intervals and the second set of parallel lines may be progressively spaced farther apart from each other.

The first set of parallel lines and the second set of parallel lines may include horizontal lines and vertical lines.

Each of the unit cell patterns may include an arrangement of the first set of parallel lines and the second set of parallel lines, a copy of the arrangement rotated 90°, a copy of the arrangement rotated 180°, and a copy of the arrangement rotated 270°.

A photomask includes a photomask circuit pattern disposed therein and one or more unit cell patterns disposed therein. Each of the unit cell patterns includes at least one reference design pattern including a first set of parallel lines and at least one PPE check design pattern including a second set of parallel lines that are more sparsely spaced than the first set of parallel lines.

The one or more unit cell patterns may be disposed within the photomask circuit pattern either at periodic intervals or at predetermined positions.

The first set of parallel lines may be spaced apart from the second set of parallel lines.

The first set of parallel lines may be in contact with the second set of parallel lines.

The first set of parallel lines may be spaced apart at equal intervals and the second set of parallel lines may be progressively spaced farther apart from each other.

The plurality of parallel lines may include horizontal lines and vertical lines.

Each of the unit cell patterns may include an arrangement of the first set of parallel lines and the second set of parallel lines, a copy of the arrangement rotated 90°, a copy of the arrangement rotated 180°, and a copy of the arrangement rotated 270°.

A method for measuring pattern placement error (PPE) on a wafer includes imaging a wafer having a pattern including a circuit pattern and one or more unit cell patterns using a microscope. Each of the one or more unit cell patterns includes at least one reference design pattern and at least one PPE check design pattern. Pattern placement error is measured as a displacement between the at least one reference design pattern and the at least one PPE check design pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 1 is a flow chart illustrating an approach for detecting and quantifying PPE in accordance with exemplary embodiments of the present inventive concept;

FIG. 3 is a schematic diagram illustrating several examples of unit cell patterns in accordance with exemplary embodiments of the present inventive concept;

DETAILED DESCRIPTION OF THE DRAWINGS

Figure 2A:
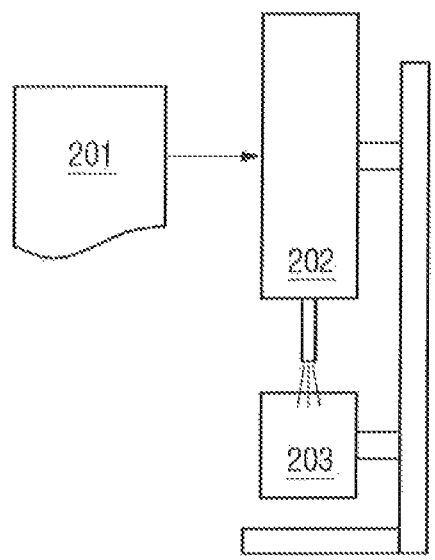
FIGS. 2A, 2B, and 2C are schematic diagrams illustrating a system for detecting and quantifying PPE according to exemplary embodiments of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present inventive concept provide a system and method for detecting and quantifying an extent of pattern placement error (PPE) on a wafer. By detecting and quantifying PPE on a wafer, fabrication may be fine-tuned to minimize PPE thereby increasing manufacturing yield and minimizing waste.

Figure 2B:
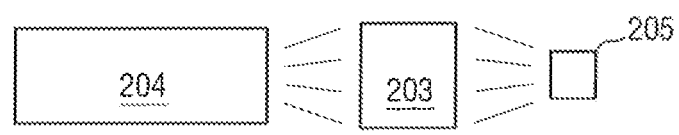
Figure 2C:
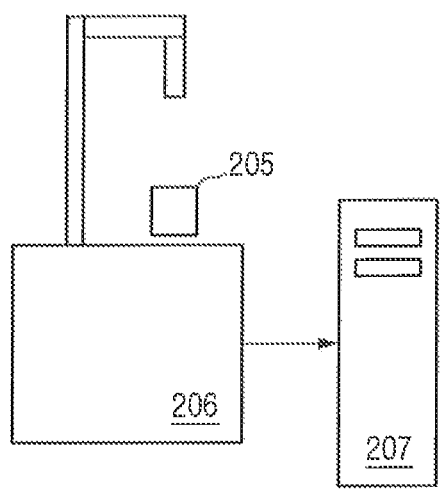

FIG. 1 is a flow chart illustrating an approach for detecting and quantifying PPE in accordance with exemplary embodiments of the present inventive concept. FIGS. 2A, 2B, and 2C are schematic diagrams illustrating a system for detecting and quantifying PPE according to exemplary embodiments of the present inventive concept. One or more unit cell designs may be included in the pattern 201 of a photomask (Step S101). Each unit cell design may be included at multiple locations within the photomask pattern, for example, at regular intervals and/or at key locations. This may be accomplished by adding the various unit cells to a photomask pattern design. It is to be understood that multiple different types of unit cells may be added to the photomask pattern and each type of unit cell may be repeated any number of times.

The photomask pattern, including the unit cell designs, 201 may be used to generate a photomask 203, for example, using an exposure tool 202 such as an electron beam or a laser exposure tool, which may expose a pattern on a blank photomask. Subsequent processing may then be performed to finalize the photomask.

The unit cell design is a test pattern that includes each of two elements. The first element is a reference design and the second element is a PPE check design. The reference design includes patterns that are not likely to cause pattern shift, for example, as a result of EUV photolithography. The reference design may include patterns that are identical to each other. The PPE check design may include patterns that are likely to experience pattern shift. While each instantiation of the reference design may be identical, the various instantiations of the PPE check design may be different from one another. Both the reference design and the PPE check design may include sets of vertical and/or horizontal lines. However, the line pitch (the spacing between lines) of the PPE check design may vary from instantiation to instantiation while the line pitch of the reference design may be identical from instantiation to instantiation.

Then, the photomask 203 including the unit cell design may be used to fabricate a semiconductor wafer 205 (Step S102). This may be performed, for example, using photolithography and various other semiconductor processing steps. For example, the semiconductor wafer 205 may be exposed to EUV, using an EUV tool 204, through the photomask 203 to expose the pattern of the mask onto the semiconductor wafer 205. A stepper tool may also be used to reduce the size of the pattern of the mask onto the semiconductor wafer.

The fabricated semiconductor wafer 205 may next be imaged, for example, using a microscope such as a critical dimension scanning electron microscope (CD-SEM) 206 (Step S103). However, other forms of microscopes could be used. The image data produced from the microscope may be interpreted, using a computer system 207, to detect and quantify PPE (Step S104). This may be performed, for example, by measuring a position of the PPE check design relative to the corresponding reference design, for each unit cell design. This measured position may be a pattern shift value, and a pattern shift value may accordingly be measured for each unit cell design. The pattern shift value may represent a displacement between the PPE check design and the corresponding reference design in each of the vertical and horizontal directions. In addition to calculating the pattern shift values for the vertical and horizontal directions, other information about the horizontal and vertical bias on the unit cell design may be measured. Moreover, as the PPE check design and the reference design may be repeatedly provided within each unit cell design, pattern shift values may also be measured from a PPE check design to a reference design that is diagonally proximate. This diagonal pattern shift value may be measured in the diagonal direction.

While these shift values may be used to assess the quality of the fabricated wafer (Step S105), another use for the shift values is to compare them to expected shift values that have been calculated directly from the photomask pattern using computational lithography simulation (Step S106) that is performed on the photomask's pattern file. In this respect, the quality of the computational lithography simulation itself may be assessed (Step S107).

Examples of suitable computational lithography simulation include optical proximity correction (OPC) and resolution enhancement technology (RET).

As discussed above, the unit cells may include sets of horizontal and/or vertical lines, with the reference design thereof showing relatively less placement error than the PPE check design. FIG. 3 is a schematic diagram illustrating several examples of unit cell patterns in accordance with exemplary embodiments of the present inventive concept. It is to be understood that the number of reference design lines and PPE check design lines illustrated in FIG. 3, and the other figures of the instant application, have been reduced for the purposes of providing a simplified illustration, and the actual number of lines may be substantially more than the number of lines shown.

In the first exemplary unit cell 301, the reference design (solid bars) are shown to be spaced apart from the PPE check design (hatched bars). The reference design and the PPE check design may each include multiple horizontal lines, with the lines of the reference design being more densely spaced and the lines of the PPE check design being more sparsely spaced. Here, the lines of the reference design are of the same length as the lines of the PPE check design.

In the second exemplary unit cell 302, the horizontal lines of the reference design are shorter than the horizontal lines of the PPE check design and the horizontal lines of the PPE check design make contact with at least some of the horizontal lines of the reference design. However, as is the case for the first exemplary unit cell 301, here, the lengths of all reference design lines are the same as each other and the lengths of all PPE check design lines are the same as each other, and the reference design lines are more densely spaced while the PPE check design lines are more sparsely spaced.

Within each unit cell, there may be multiple sets of reference design lines and/or multiple sets of PPE check design lines. In the third exemplary unit cell 303, there are two sets of reference design lines and one set of PPE check design lines. However, as in the cases above, the lines of the reference design are more densely spaced while the lines of the PPE check design are more sparsely spaced. In this case, once again, the PPE check design lines make contact with at least some of the reference design lines.

As separated reference design lines and PPE check design lines may give rise to a different PPE than reference design lines and PPE check design lines that make contact to each other, unit cells featuring both approaches may be used within a single photomask pattern.

One or more of the above-described unit cells may be provided within a single photomask, for example, at regular intervals and/or at key points so that PPE can be detected and quantified by the displacement between the PPE check design and the reference design, on the fabricated wafer, for each unit cell and so the distribution of PPE throughout the entire fabricated wafer may be understood.

Figure 4:
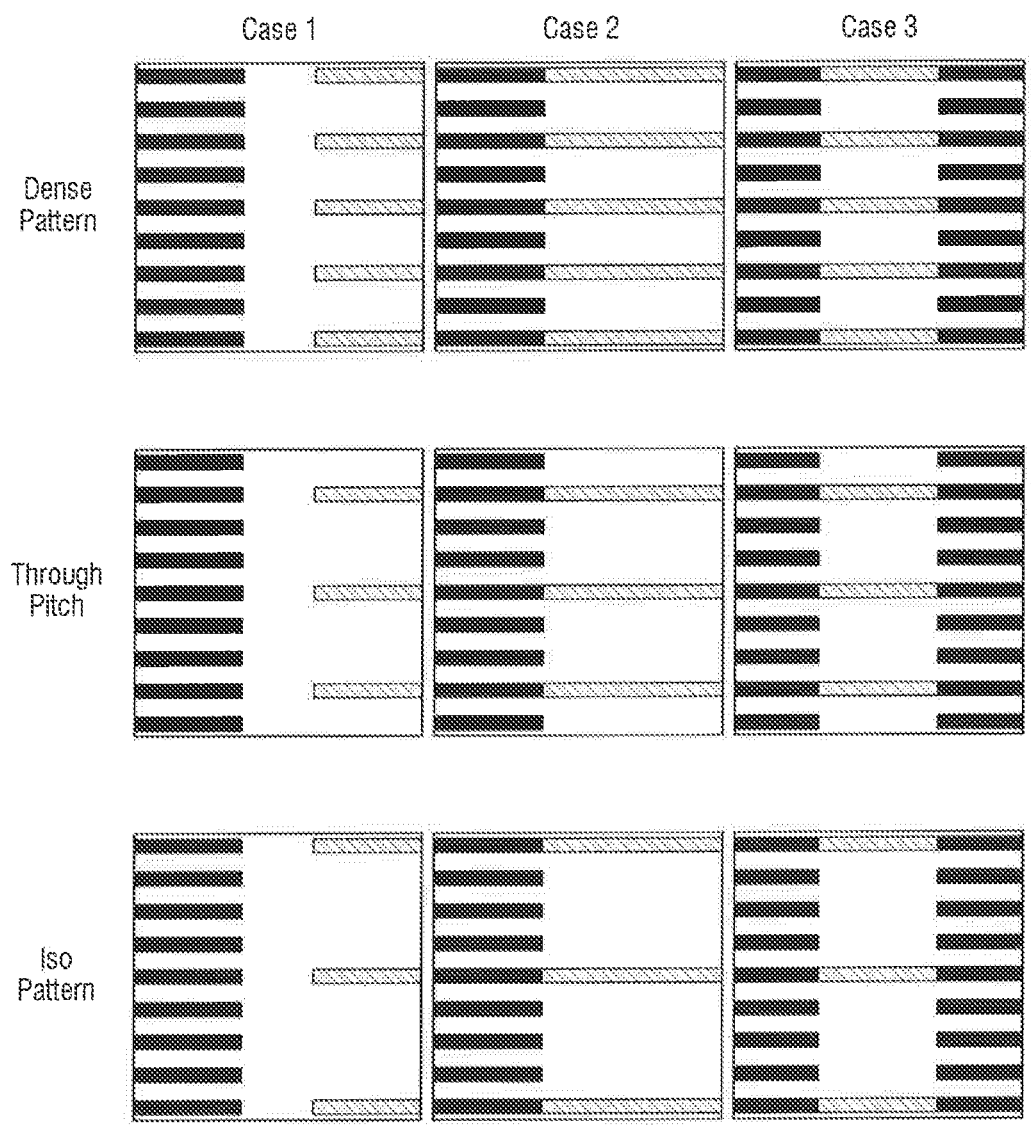
FIG. 4 is a schematic diagram illustrating several examples of unit cell patterns having changing spacing in accordance with exemplary embodiments of the present inventive concept.

Moreover, while the spacing of the reference design may be kept constant throughout the unit cell, the spacing of the PPE check design may change. FIG. 4 is a schematic diagram illustrating several examples of unit cell patterns having changing spacing in accordance with exemplary embodiments of the present inventive concept. In case 1, which includes the depiction of three unit cells, the reference design lines (solid-filled bars) are shown as spaced apart from the PPE check design lines (hatched-filled bars). The arrangement is shown as being changed in three groups. In the first group, identified as the "dense pattern," the PPE check design lines are most dense, even though they are still more sparsely disposed than the reference design lines. In the second group, identified as the "through pitch," the PPE check design lines are less densely spaced than the PPE check design lines of the dense pattern group. In the third group, identified as the "iso pattern," the PPE check design lines are less densely spaced than the PPE check design lines of the through pitch group. Once again, it is to be understood that in the figures, the number of lines shown have been reduced to provide a simpler illustration.

The reference design lines are identically spaced within each of the three groups so that the PPE design check pattern may always be measured with respect to identical reference design patterns.

In FIG. 4, case 1 is analogous to the first unit cell 301 of FIG. 3, case 2 is analogous to the second unit cell 302, and case 3 is analogous to the third unit cell 303, however, FIG. 4 further shows the change in PPE check design line spacing, as described above.

Figure 5:
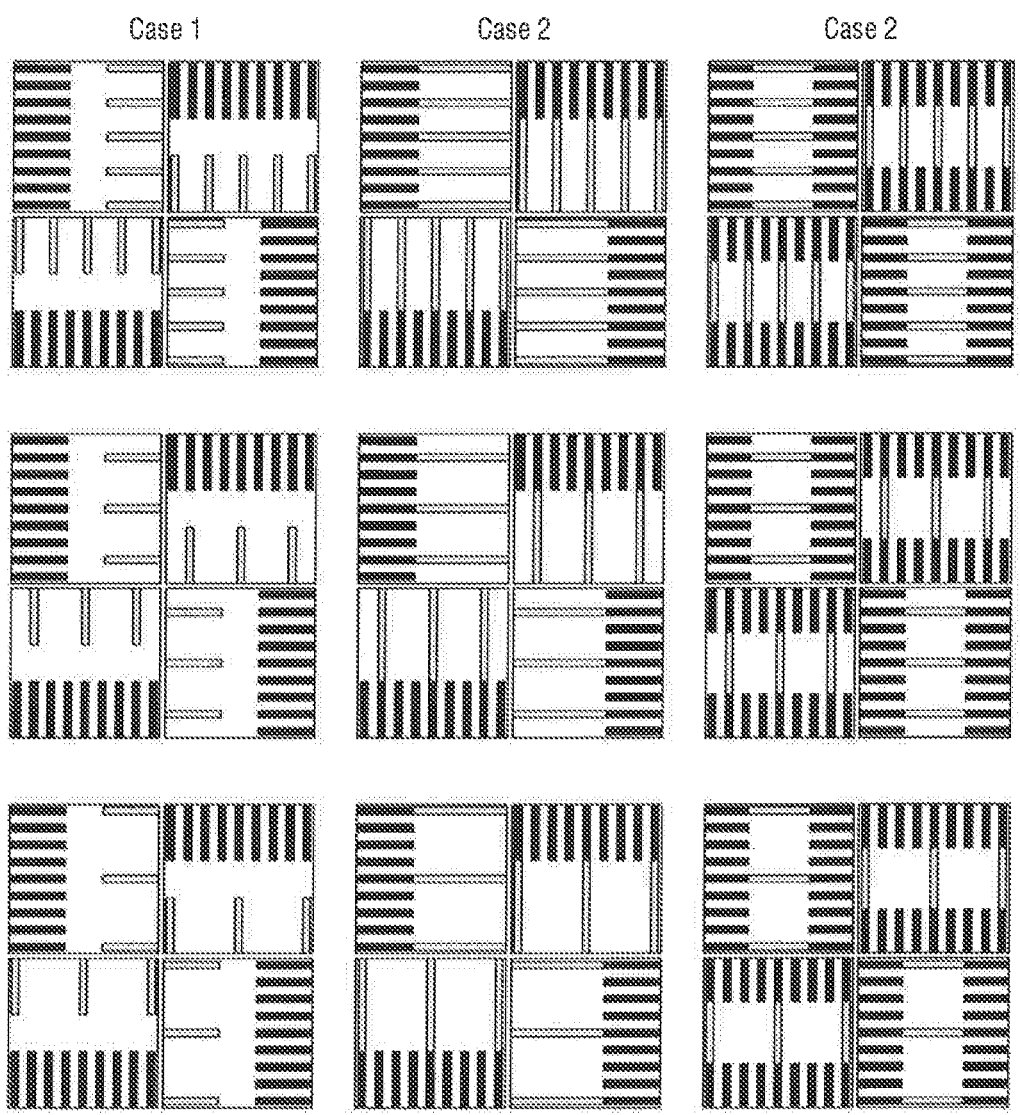
FIG. 5 is a schematic diagram illustrating several examples of unit cell patterns having horizontal and vertical lines and changing spacing in accordance with exemplary embodiments of the present inventive concept.

As discussed above, unit cells may include both horizontal and vertical lines so that pattern shift may be measured in both the horizontal and vertical directions. FIG. 5 is a schematic diagram illustrating several examples of unit cell patterns having horizontal and vertical lines and changing spacing in accordance with exemplary embodiments of the present inventive concept.

As can be seen from this figure, in case 1, a similar pattern of reference design lines and PPE check design lines are rotated 0° (not rotated), 90°, 180°, and 270°, for example, all in the clockwise direction, although they could alternatively be rotated in the counter-clockwise direction. Case 1 here corresponds to case 1 illustrated in FIG. 4 as well as the first unit cell 301 shown in FIG. 3. This set of 4-rotations may comprise a single unit cell design, and as is the case illustrated in FIG. 4, here, there is a dense pattern unit cell, a through pitch unit cell, and an iso pattern unit cell. There is similarly a case 2 and a case 3, as is shown and described with respect to FIGS. 3 and 4, with the primary difference being that the unit cells illustrated in FIG. 5 each include one of the unit cells illustrated in FIG. 4, with the above-described set of rotations at 0°, 90°, 180°, and 270°.

By providing the unit cell designs with rotating patterns therein, PPE may be measured in each of the four angular orientations (0°, 90°, 180°, and 270°). Moreover, PPE may be measured in the diagonal direction, for example, by examining the displacement between the reference design lines of the 0° rotation and the PPE check design lines of the 180° rotation. However, diagonal direction PPE may alternatively or additionally be measured between any set of reference design lines and a set of PPE check design lines that is 180° different. Thus, there are 4 possible ways in which to measure the diagonal direction PPE within each unit cell, and according to one exemplary embodiment of the present inventive concept, all four measurements may be taken for each unit cell. In such a case, as there would be four sets of horizontal/vertical displacement, each unit cell would have eight PPE measurements.

Figure 6:
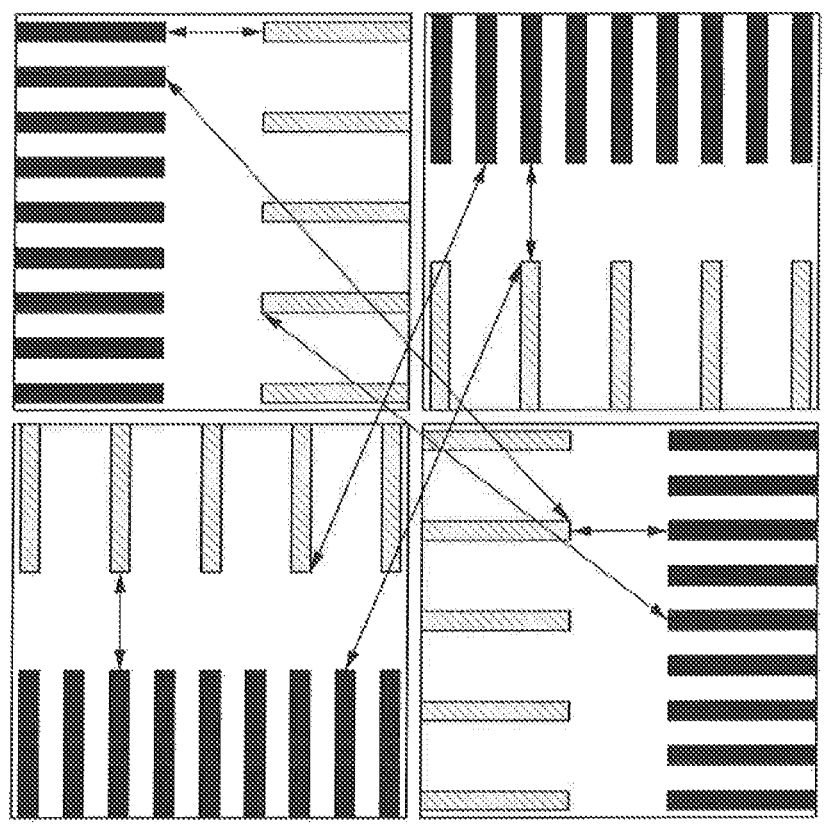
FIG. 6 is a schematic diagram illustrating how eight PPE measurements may be taken in accordance with exemplary embodiments of the present inventive concept.

FIG. 6 is a schematic diagram illustrating how eight PPE measurements may be taken in accordance with exemplary embodiments of the present inventive concept. Each measurement, illustrated as a double-arrowed line, represents a distance between reference design lines and corresponding PPE check design lines, in both the horizontal and vertical directions. Also represented are the diagonal displacements drawn between reference design lines of one angular orientation and PPE check design lines of another angular orientation that is diagonally disposed.

Figure 7:
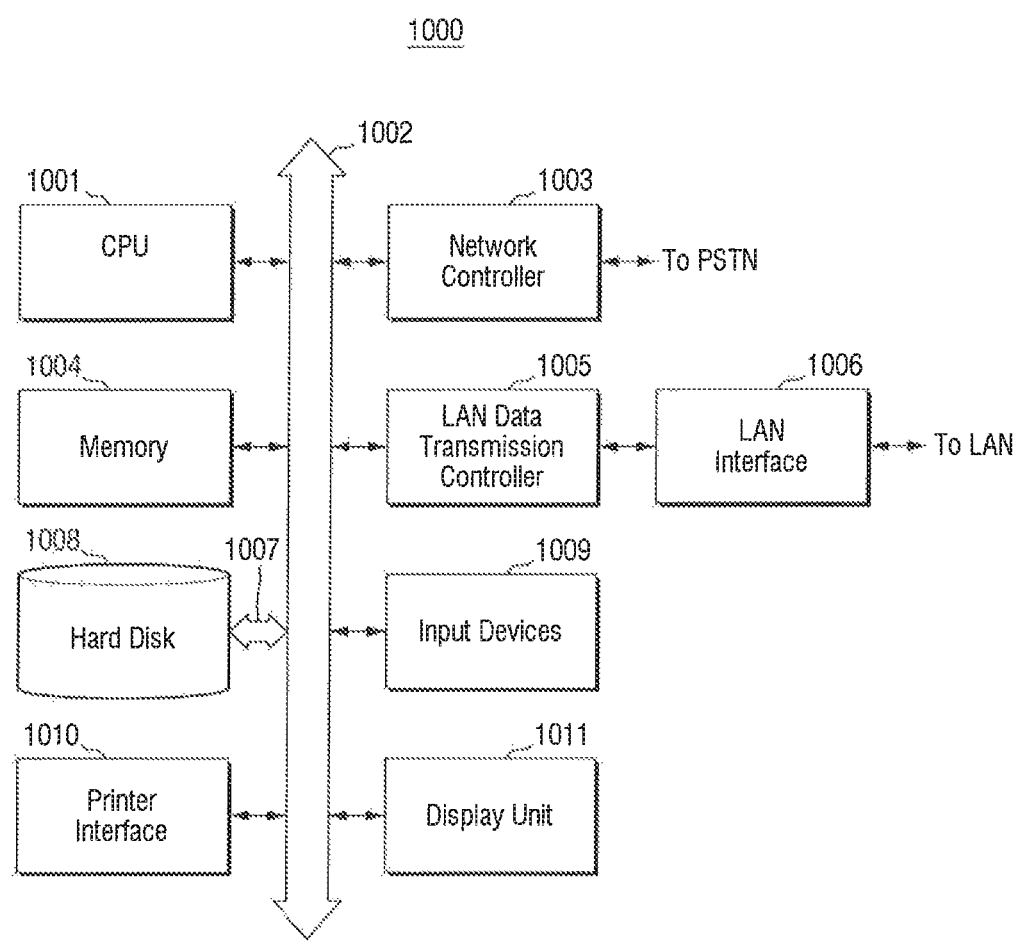
FIG. 7 shows an example of a computer system which may perform PPE measurement calculation in accordance with exemplary embodiments of the present inventive concept.

As discussed above, the PPE measurements may be calculated using a computer system 207 from the microscope image data capturing the semiconductor wafer 205. FIG. 7 shows an example of a computer system which may perform this calculation in accordance with exemplary embodiments of the present inventive concept. The PPE measurement calculating computer system may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for measuring pattern placement error (PPE) on a wafer, comprising:
   receiving a photomask pattern;
   adding one or more unit cell patterns to the photomask pattern, each of the unit cell patterns including at least one reference design pattern and at least one PPE check design pattern;
   fabricating a photomask from the photomask pattern with the one or more unit cell patterns added thereto;
   patterning the wafer using the fabricated photomask;
   acquiring a microscope image of the patterned wafer; and
   calculating pattern placement error from the microscope image of the patterned wafer, by measuring a first displacement between the at least one reference design pattern on the patterned wafer and a corresponding structure on the photomask, measuring a second displacement between the at least one PPE check design pattern on the patterned wafer and a corresponding structure on the photomask, and determining a difference between the first displacement and the second displacement,
   wherein the unit cell pattern is a test pattern and the reference design pattern is configured to cause less pattern shift than the PPE check design pattern.

2. The method of claim 1, further comprising:
   performing computational lithography simulation on the photomask pattern; and
   comparing results of the computational lithography simulation with the measured pattern placement error to determine an efficacy of the computational lithography simulation.

3. The method of claim 1, wherein the one or more unit cell patterns are added to the photomask pattern either at periodic intervals or at predetermined positions.

4. The method of claim 2, wherein each of the unit cell patterns includes a plurality of parallel lines.

5. The method of claim 4, wherein the plurality of parallel lines includes a first set of parallel lines that are part of the reference design pattern and a second set of parallel lines that are part of the PPE check design pattern.

6. The method of claim 5, wherein the first set of parallel lines are more densely spaced than the second set of parallel lines.

7. The method of claim 5, wherein the first set of parallel lines are spaced apart from the second set of parallel lines.

8. The method of claim 5, wherein the first set of parallel lines are in contact with the second set of parallel lines.

9. The method of claim 5, wherein the first set of parallel lines are disposed on opposite sides of the second set of parallel lines.

10. The method of claim 5, wherein the first set of parallel lines are spaced apart at equal intervals and the second set of parallel lines are progressively spaced farther apart from each other.

11. The method of claim 5, wherein the plurality of parallel lines includes horizontal lines and vertical lines.

12. The method of claim 5, wherein each of the unit cell patterns includes an arrangement of the first set of parallel lines and the second set of parallel lines, a copy of the arrangement rotated 90°, a copy of the arrangement rotated 180°, and a copy of the arrangement rotated 270°.

13. A method for fabricating a semiconductor wafer, comprising:
    fabricating a photomask which includes a photomask circuit pattern disposed therein, and one or more unit cell patterns disposed therein, each of the unit cell patterns including at least one reference design pattern including a first set of parallel lines and at least one PPE check design pattern including a second set of parallel lines that are more sparsely spaced than the first set of parallel lines; and
    patterning the semiconductor wafer using the fabricated photomask,
    acquiring a microscope image of the patterned semiconductor wafer; and
    calculating pattern placement error from the microscope image of the patterned semiconductor wafer, by measuring a first displacement between the at least one reference design pattern on the patterned wafer and a corresponding structure on the photomask, measuring a second displacement between the at least one PPE check design pattern on the patterned wafer and a corresponding structure on the photomask, and determining a difference between the first displacement and the second displacement,
    wherein each of the unit cell patterns includes an arrangement of the first set of parallel lines and the second set of parallel lines, a copy of the arrangement rotated 90°, a copy of the arrangement rotated 180°, and a copy of the arrangement rotated 270°.

* * * * *